United States Patent [19]

Kita

[11] 4,165,226

[45] Aug. 21, 1979

[54] PROCESS FOR PREPARING AN ELEMENT OF A DUAL-IN-LINE CERAMIC PACKAGE PROVIDED WITH A LAYER OF SEALING GLASS

[75] Inventor: Katsuhiko Kita, Nagoya, Japan

[73] Assignee: Narumi China Corporation, Aichi, Japan

[21] Appl. No.: 891,176

[22] Filed: Mar. 29, 1978

[30] Foreign Application Priority Data

Mar. 29, 1977 [JP] Japan .................................. 52/35836
Aug. 11, 1977 [JP] Japan .................................. 52/96840

[51] Int. Cl.$^2$ ............................................. C03C 27/00
[52] U.S. Cl. ......................................... 65/42; 65/18; 65/144; 264/63; 264/67
[58] Field of Search ...................... 65/18, 23, 42, 144; 428/65, 338, 402, 426; 264/63, 67

[56] References Cited

U.S. PATENT DOCUMENTS

| | | | |
|---|---|---|---|
| 2,466,849 | 4/1949 | Hood | 65/18 X |
| 2,842,500 | 7/1958 | Gibson et al. | 264/63 |
| 3,725,186 | 4/1973 | Lynch | 264/67 X |
| 3,988,405 | 10/1976 | Smith et al. | 65/18 X |
| 4,009,238 | 2/1977 | Niedermeier et al. | 264/63 X |
| 4,021,216 | 5/1977 | Asam et al. | 65/42 X |

*Primary Examiner*—Arthur D. Kellogg
*Attorney, Agent, or Firm*—Oblon, Fisher, Spivak, McClelland & Maier

[57] ABSTRACT

An element of a dual-in-line ceramic package such as a substrate or cover provided with a layer of sealing glass is prepared by forming powdered low-melting sealing glass into a shape conforming to that of the element, compressing and sintering the shaped powdered glass to form a solid sintered sealing glass preform, applying the preform to the surface of the element, and fusing it thereto by heating the assembly.

10 Claims, 6 Drawing Figures

PROCESS FOR PREPARING AN ELEMENT OF A DUAL-IN-LINE CERAMIC PACKAGE PROVIDED WITH A LAYER OF SEALING GLASS

BACKGROUND OF THE INVENTION

1. Field of the Invention

This invention relates to the manufacture of ceramic dual-in-line packages and more particularly to preparing elements of dual-in-line packages having a layer of sealing glass fused to the surface.

2. Description of the Prior Art

Integrated circuits, formed on a small chip of silicon, are often enclosed in a dual-in-line package which is a rectangular enclosure having electrically conducting pins extending from two parallel sides of the package for making electrical connections to the enclosed integrated circuit. When such packages are made of ceramic they comprise a ceramic substrate (for example, about 7 mm wide $\times$ 20 mm long $\times$ 1.9 mm thick) having a depression in the center of one of the large flat surfaces. The bottom of the depression is usually coated with gold to serve as an electrical contact. The silicon chip containing the integrated circuit is bonded to the bottom of the depression. The lead pins are then located along the long sides of the substrate in a lead frame and are connected to the integrated circuit. A ceramic cover, having about the same length and width as the substrate but a smaller thickness, e.g., about 1.3 mm, and optionally also having a central depression, is then placed on top of the substrate. Either the substrate and/or the cover is provided with a layer of low-melting sealing glass disposed generally around the edges of a mating face. After assembly the package is heated to a temperature at which the sealing glass softens and forms a bond and seal between the cover and the substrate.

Hitherto, the layer of sealing glass on the substrate or cover has been formed by a method involving screen printing. According to the screen printing process, a paste comprising a mixture of powdered low-melting sealing glass and a binder, such as a synthetic resin dissolved in a suitable solvent, is applied to the substrate and/or cover by screen printing and dried. The steps of application and drying are repeated several times in order to build up the layer to the proper thickness (0.35–0.5 mm). The layer is then fixed by baking, i.e., by raising the temperature of the coated element to about 410° C. over a period of about 1.5 hours.

This method of preparing the element having a layer of sealing glass is very inefficient. It requires three to six screen printing and drying operations to build up the required film thickness of 0.35–0.5 mm. Furthermore, since the printed film shrinks about 30% when it is baked, the printed layer must be made oversize to account for the shrinkage. Since the printed paste thus extends over the sides of the substrate, the process has the further drawback that the sealing glass may adhere to the sides of the substrate or damage the gold plating of the central depression where the silicon chip is mounted. In addition, proper registration of the successive printing steps is difficult to attain and hence it is difficult to obtain glass layers of exact dimensions, even with careful work.

Another problem with the printing technique is the frequent presence of air bubbles which are formed in the glass layer and cause pinholes which prevent the seal from being perfectly gas-tight.

Therefore, a need has continued to exist for a method of providing an element of a dual-in-line package having a layer of sealing glass and therefore being ready for assembly which overcomes the deficiencies of the previously known methods.

SUMMARY OF THE INVENTION

Accordingly, it is an object of this invention to provide a method of preparing elements of dual-in-line packages having a layer of sealing glass fused to one of their surfaces.

A further object of this invention is to provide a simpler and more economical method of preparing an element of a dual-in-line package having a layer of sealing glass.

The process of this invention comprises forming powdered low-melting sealing glass into a shape corresponding to the element to be coated, compressing and sintering said shaped powdered sealing glass to form a solid sintered sealing glass preform, applying the preform to the surface of the element and fusing the preform to the element by heating the assembly of preform and element.

The solid sintered sealing glass preform may be prepared by mixing the powdered glass with a binder, compressing the mixture into a blank of the appropriate shape, and heating blank to sinter the glass particles and remove the binder.

In another embodiment of the invention, the sintered glass preform is prepared by sintering powdered low-melting sealing glass under heat and pressure in a mold of appropriate size and shape.

DETAILED DESCRIPTION OF THE PREFERRED EMBODIMENTS

Figure 1A:
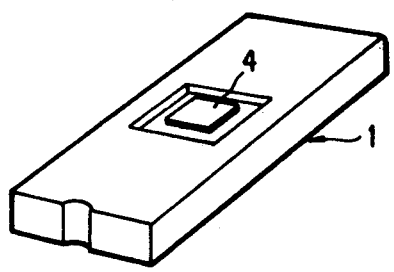
FIG. 1A shows the substrate 1 of a ceramic dual-in-line package with an integrated circuit 4 bonded in the central recess.
Figure 1B:
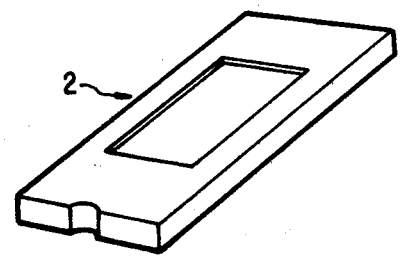
FIG. 1B shows the cover 2 of the ceramic dual-in-line package.
Figure 2:
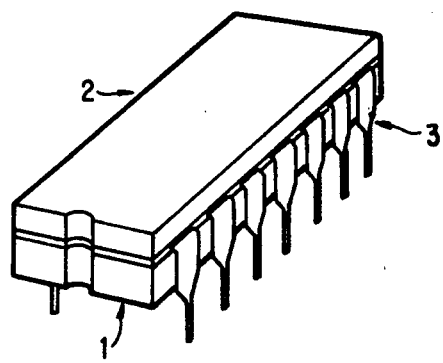
FIG. 2 shows an assembled ceramic dual-in-line package showing the substrate 1, lead frame 3, and cover 2.
Figure 3:
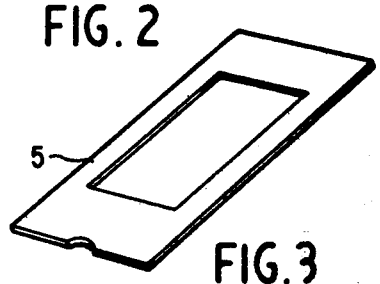
FIG. 3 shows a typical glass preform 5 having the proper shape to seal the edges of the cover and substrate of the ceramic dual-in-line package.

In forming a sintered sealing glass preform by the process of this invention powdered low-melting sealing glass is molded to the desired shape and heated to sinter the particles of glass into a solid thin glass wafer of a shape suitable for sealing the edges of the cover and substrate of a ceramic dual-in-line package. A typical shape is that illustrated in FIG. 3.

In one embodiment of the invention fine powder, 100 mesh or finer, of glass having a softening point of about 350° C. is mixed with a binder and formed into a blank of the proper shape by compression molding in a die, e.g. a metal die.

The binder may be any material which will retain the glass particles in the proper shape when molded at relatively low temperatures such as room temperature, but which will decompose, or burn away at the temperatures used (300°–390° C.) for sintering the molded preform subsequently. Suitable binders include synthetic polymeric resins dissolved in a solvent. A preferred binder comprises a 10% solution of an acrylic resin dissolved in a solvent such as toluene or xylene. Since the binder coats each particle of glass when it is mixed with the powder, less binder can be used than is required in the process using screen printing. The amount of resin can also be reduced to about 75% of that used in the case of screen printed glass sealing layers.

After the glass powder is mixed with the resinous binder the powder is molded into the desired shape for the sealing glass preform. This molding is carried out by conventional compression molding using dies of the proper shape and size. Since some shrinkage occurs in the subsequent sintering operation, allowance must be made for this in molding the powder preform. The shrinkage is generally about 10%, which compares favorably with the 30% shrinkage commonly observed with the conventional screen printing process.

It has been found that the use of a water-insoluble resin and solvent as the binder for the glass powder prevents adhesion of the powder to the die during the molding steps. Hence such binders and solvents are preferred. Most preferred binders and solvents are acrylic resins and aromatic solvents such as toluene or xylene.

The molding pressure used in molding the powder into properly shaped preforms may be any pressure which suffices to compress the powder into a self-coherent mass which will retain its shape through the handling needed to prepare the final sintered glass preform. Typical pressures range from 450 kg/cm² to 1400 kg/cm². The pressure used will have some effect on the properties of the preforms. Higher pressures generally produce a molded powder which shrinks somewhat less during sintering. The relation between molding pressure and shrinkage during sintering is shown in Table 1 which follows:

TABLE 1

| Pressing pressure kg/cm² | Shrinkage (%) | |
|---|---|---|
| | Sintering | Baking |
| 450 | 10 | 2 |
| 650 | 9 | 1 |
| 850 | 9 | 1 |
| 1000 | 9 | 1 |
| 1200 | 9 | 1 |
| 1400 | 8 | 0.8 |

It may be seen, for example that the shrinkage will be about 9% when a molding pressure of 650 kg/cm² is used and the die can be designed to allow for this.

Pinholes in the glass preform may be formed by residual solvent or resin which escapes later during the sealing of the ceramic dual-in-line package. However, the most common cause of pinholes is air bubbles which remain between the particles of glass during sintering. Higher molding pressures decrease the formation of pinholes. Pressures over 600 kg/cm² are generally effective to prevent pinholes. Pressures over 1000 kg/cm² do not generally further decrease the likelihood of pinhole formation. Hence the preferred molding pressures are 600 kg/cm² or greater and most preferably between 600 and 1000 kg/cm².

The molded powder is then sintered. During the sintering the binder is burned away or volatilized and the glass powder becomes a cohesive glass preform which can be handled easily. The sintered preform can be stored indefinitely if necessary.

Figure 5:
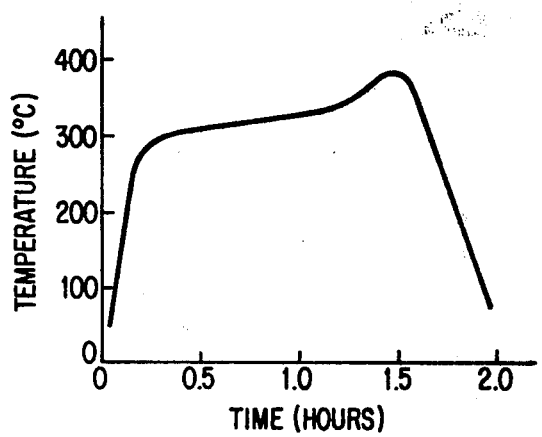
FIG. 5 illustrates the heating schedule for preparing the sintered glass preform when a binder is used to mold the blank for the preform.

The sintering is carried out by gradually heating the molded powder, keeping the blank in the temperature range of 300° C. to 340° C. for a long enough time to burn away any residual carbon from the binder which might cause pinholes later when the package is sealed. The sintering is completed by raising the temperature to 390° C. after about 1.5 hours. The highest temperature of the sintering step must be carefully controlled because the glass may begin to melt at higher temperatures and adhere to the support. A typical heating schedule for the sintering is shown in FIG. 5.

In another embodiment of this invention, no binder is used but the glass powder is directly placed into molding dies heated to a temperature higher than the glass transition temperature but lower than the softening temperature and the powder is formed by heat and pressure in the die into a solid glass preform of the desired size and shape. Since this method uses no binder, it eliminates the step of mixing the glass powder with the binder as well as the sintering procedure to remove the binder. This procedure also reduces the number of pinholes caused by the presence of the binder.

In this embodiment of the invention the dies which have the shape and thickness of the preform desired for a particular application are heated to a temperature higher than the glass transition temperature of the sealing glass but lower than its softening temperature. This temperature will depend upon the particular sealing glass being used but will generally be in the range of 350°–380° C. for the glasses in common use. The glass powder is then loaded into the heated die and compressed at a pressure of 500 kg/cm² or more. The powder is thereby formed into a thin solid glass preform of the required shape and thickness (0.4–0.5 mm).

Figure 4:
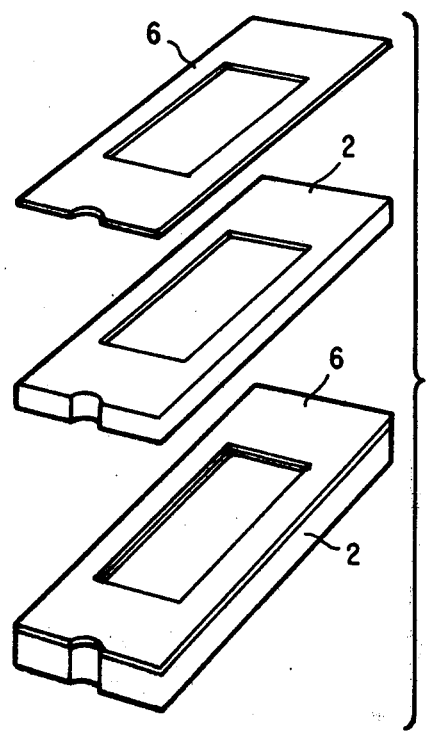
FIG. 4 illustrates the assembly of the sintered glass preform 6 to the cover 2 of a ceramic dual-in-line package.

Finally the sintered glass preform is mounted on a surface of the substrate and/or cover and is baked at a temperature of 405° C. to 410° C. to fuse the glass to the material to be sealed. FIG. 4 shows the sintered glass preform 6 applied to a cover 2 to form an assembly which is baked to fuse the glass to the cover. In the baking step the shrinkage is generally 1% or less as shown in Table 1, so that dimensional change in this step is not a problem.

The process of this invention prepares sealing glass preforms having dimensional accuracy, a minimum of deviation from the proper thickness, and smooth surfaces, all of which make it easier to control the quality in the subsequent steps in the sealing process than when the screen printing process is used. Moreover, since the process of this invention does not require as much skilled labor as the screen printing process and has fewer steps it is more suitable for large-scale factory production and increases the efficiency of the manufacturing process with accompanying reduction of production costs.

Having now fully described the invention, it will be apparent to one of ordinary skill in the art that many changes and modifications can be made thereto without departing from the spirit or scope of the invention as set forth herein.

What is claimed as new and sought to be covered by Letters Patent is:

1. In a process for hermetically sealing together the substrate and cover of a ceramic dual-in-line package, the improvement comprising:

(1) forming powdered low-melting sealing glass into a shape corresponding to the peripheral area of said substrate and/or cover, (2) compressing and sintering said shaped powdered sealing glass, whereby a solid sintered sealing glass preform is produced, (3) positioning said preform together with a lead frame between said substrate and cover of said dual-in-line ceramic package to be sealed, whereby an assembly of said substrate, lead frame, preform and cover is produced, (4) heating said assembly to fuse said sealing glass, whereby an hermetic seal is formed between said substrate and cover.

2. The process of claim 1, wherein said preform is prepared by mixing said powdered low-melting sealing glass with a binder, whereby a powder is formed, forming said powder into a shape corresponding to the peripheral area of the substrate and/or cover of a ceramic dual-in-line package, compressing said formed powder, whereby a blank is formed, and sintering said blank.

3. The process of claim 2, wherein the pressure used in compressing said shaped powder is at least 600 kg/cm$^2$.

4. The process of claim 3, wherein said pressure is between 600 kg/cm$^2$ and 1000 kg/cm$^2$.

5. The process of claim 2, wherein said sintering is accomplished by gradually increasing the temperature of said blank in a range from 300° C. to 340° C. whereby said binder is removed and subsequently heating said blank to a temperature of about 390° C. to complete the sintering.

6. The process of claim 5, wherein said heating from 300° C. to 390° C. takes place over a period of 1.5 hours.

7. The process of claim 2, wherein said binder is an acrylic resin.

8. The process of claim 1, wherein said preform is prepared by sintering powdered low-melting sealing glass under pressure in a die at a temperature above the glass transition temperature of said sealing glass and below the softening point of said glass.

9. The process of claim 8, wherein said pressure is at least 500 kg/cm$^2$.

10. A process according to claim 1, wherein, before said preform is positioned between said substrate and said cover, said preform is fused to said substrate and/or cover.

* * * * *